(12) United States Patent
Zhang et al.

(10) Patent No.: US 10,252,299 B2
(45) Date of Patent: Apr. 9, 2019

(54) AIR CURTAIN DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Chunze Zhang, Beijing (CN); Wei Li, Beijing (CN); Kai Yu, Beijing (CN); Cong Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 136 days.

(21) Appl. No.: 15/504,629

(22) PCT Filed: Jun. 2, 2016

(86) PCT No.: PCT/CN2016/084491
§ 371 (c)(1),
(2) Date: Feb. 16, 2017

(87) PCT Pub. No.: WO2017/148030
PCT Pub. Date: Sep. 8, 2017

(65) Prior Publication Data
US 2018/0104724 A1 Apr. 19, 2018

(30) Foreign Application Priority Data

Mar. 4, 2016 (CN) .......................... 2016 1 0125912

(51) Int. Cl.
*B08B 5/02* (2006.01)
*F26B 21/00* (2006.01)
*H01L 21/67* (2006.01)

(52) U.S. Cl.
CPC .............. *B08B 5/02* (2013.01); *F26B 21/004* (2013.01); *H01L 21/67028* (2013.01); *H01L 21/67034* (2013.01)

(58) Field of Classification Search
CPC ................. B08B 5/02; H01L 21/67028; H01L 21/67034
(Continued)

(56) References Cited

U.S. PATENT DOCUMENTS 3,590,495 A * 7/1971 Tyson .................... B29D 30/38
34/654
3,726,204 A * 4/1973 Lindestrom ............... F24F 7/10
454/187
(Continued)

FOREIGN PATENT DOCUMENTS

CA 2471860 A1 * 7/2003 .............. F26B 15/18
CA 2471860 C * 5/2011 .............. F26B 15/18
(Continued)

OTHER PUBLICATIONS

"Second office action," CN Application No. 201610125912.0 (dated Apr. 2, 2018).
(Continued)

*Primary Examiner* — Stephen M Gravini
(74) *Attorney, Agent, or Firm* — Womble Bond Dickinson (US) LLP

(57) ABSTRACT

An air curtain device is provided. The air curtain device comprises a pressure limiting module, and an air curtain body communicating with the pressure limiting module. The pressure limiting module is provided with a pressure limiting chamber, which has an air inlet connected with a gas source and a first air outlet communicating with the air curtain body. The pressure limiting chamber is provided with a pressure linking member, which is capable of changing a cross-sectional area of the first air outlet through which
(Continued)

the gas flow passes in accordance with variation of pressure in the pressure limiting chamber, so that the gas flow output from the first air outlet has a pressure which is kept in a preset range. This ensures a stable flux for the gas flow output from the air curtain device, and increases the yield for fabricating the array substrate.

20 Claims, 13 Drawing Sheets

(58) Field of Classification Search
USPC .......................................................... 34/90
See application file for complete search history.

(56) References Cited

U.S. PATENT DOCUMENTS

| | | | | |
|---|---|---|---|---|
| 3,750,306 | A * | 8/1973 | Rodwin | D21F 5/006 34/115 |
| 4,561,903 | A * | 12/1985 | Blaul | B08B 15/026 134/10 |
| 4,817,301 | A * | 4/1989 | Belanger | B60S 3/002 15/316.1 |
| 4,940,376 | A * | 7/1990 | McCarthy | F27B 3/045 110/109 |
| 5,384,969 | A * | 1/1995 | Troetscher | F26B 17/04 34/236 |
| 5,553,633 | A * | 9/1996 | Ciccarelli, Jr. | B08B 3/022 134/127 |
| 5,611,476 | A * | 3/1997 | Soderlund | B23K 1/008 228/219 |
| 5,911,486 | A * | 6/1999 | Dow | B23K 3/082 34/212 |
| 6,159,294 | A * | 12/2000 | Kuster | F26B 15/22 118/324 |
| 6,282,812 | B1 * | 9/2001 | Wee | F26B 5/14 228/20.1 |
| 6,418,956 | B1 | 7/2002 | Bloom | |
| 6,444,035 | B1 * | 9/2002 | Nowak | B29C 39/10 118/684 |
| 6,760,981 | B2 * | 7/2004 | Leap | F26B 15/18 34/210 |
| 8,800,161 | B2 * | 8/2014 | Anibas | F26B 3/0923 209/344 |
| 9,349,620 | B2 * | 5/2016 | Kamata | H01L 21/67775 |
| 9,423,179 | B2 * | 8/2016 | Wieland | F26B 15/14 |
| 9,939,198 | B2 * | 4/2018 | Hoffman, Jr. | F26B 15/12 |
| 9,951,991 | B2 * | 4/2018 | Biel | F26B 21/10 |
| 9,970,708 | B2 * | 5/2018 | Zielinski | F26B 9/06 |
| 2011/0035955 | A1 * | 2/2011 | Anibas | F26B 3/0923 34/236 |
| 2015/0054265 | A1 * | 2/2015 | Deng | B60R 21/232 280/730.2 |
| 2015/0121720 | A1 * | 5/2015 | Wieland | F26B 15/14 34/493 |
| 2018/0104724 | A1 * | 4/2018 | Zhang | B08B 5/02 |

FOREIGN PATENT DOCUMENTS

| | | | |
|---|---|---|---|
| CN | 201028077 Y | 2/2008 | |
| CN | 204247422 U | 4/2015 | |
| CN | 204391054 U | 6/2015 | |
| CN | 204596758 U | 8/2015 | |
| CN | 104998773 A | 10/2015 | |
| CN | 105321843 A | 2/2016 | |
| CN | 105575859 A | 5/2016 | |
| KR | 20070093692 A | 9/2007 | |
| WO | WO 03062726 A1 * | 7/2003 | ............ F26B 15/18 |
| WO | WO 03062726 A9 * | 2/2004 | ............ F26B 15/18 |
| WO | WO 2017148030 A1 * | 9/2017 | ............ B08B 5/02 |

OTHER PUBLICATIONS

International Search Report and Written Opinion in PCT/CN2016/084491 dated Oct. 27, 2016, with English translation. 14 pages.
Office Action received for Chinese Patent Application No. 201610125912.0, dated Oct. 30, 2017, 14 pages (7 pages of English Translation and 7 pages of Office Action).

* cited by examiner

AIR CURTAIN DEVICE

RELATED APPLICATIONS

The present application is the U.S. national phase entry of PCT/CN2016/084491, with an international filing date of Jun. 2, 2016, which claims the benefit of Chinese Patent Application No. 201610125912.0, filed on Mar. 4, 2016, the entire disclosures of which are incorporated herein by reference.

TECHNICAL FIELD

The present disclosure relates to the field of display technique, and particularly to an air curtain device.

BACKGROUND

In a wet stripping process for fabricating a semiconductor device and a TFT array substrate, a wet stripping solution is generally applied to remove photoresist. The wet stripping process is a process subsequent to an etching process, and is used for removing the residual photoresist on a glass substrate. The wet stripping solution can be used to remove these photoresist, and the glass substrate is then rinsed with de-ionized water. Usually, an air curtain device is used to remove the stripping solution remaining on the glass substrate, and this avoids the effect of the residual stripping solution on the following processes.

FIG. 1 is a structural view for an air curtain device in the prior art. The air curtain device comprises a gas guiding chamber 01. The gas guiding chamber 01 has a gas inlet 02 through which air with a certain pressure and flow rate can be input. The air forms a gas flow in the gas guiding chamber 01, and is ejected through an air outlet 03 of the gas guiding chamber 01.

In practical applications, the flux of air which is input through the gas inlet 02 may increase suddenly. This leads to fluctuations in the pressure at the air outlet 03, which affects the isolating function of the air curtain device, and may even lead to ejection of foreign matter and induce defects in the array substrate.

SUMMARY

Thus, it is desired to provide an air curtain device with an improved stability in the flux of the output gas flow.

According to an aspect, an embodiment of the present disclosure provides an air curtain device. The air curtain device comprises a pressure limiting module; and an air curtain body which communicates with the pressure limiting module. The pressure limiting module is provided with a pressure limiting chamber, and the pressure limiting chamber has an air inlet which is connected with a gas source and a first air outlet which communicates with the air curtain body. The pressure limiting chamber is provided with a pressure linking member, and the pressure linking member is capable of changing a cross-sectional area of the first air outlet through which a gas flow passes in accordance with variation of pressure in the pressure limiting chamber, so that the gas flow output from the first air outlet has a pressure which is kept in a preset range.

Furthermore, the pressure linking member comprises a connecting rod which is arranged along an air input direction, the connecting rod is provided with a floater at an end close to the air inlet and a first air stopper at an end close to the first air outlet. Under the action of the gas flow, the floater drives the first air stopper to move up and down by means of the connecting rod, so that the first air stopper changes the cross-sectional area of the first air outlet through which the gas flow passes.

Furthermore, the pressure linking member further comprises a second air stopper which is arranged oppositely to the first air stopper, and an air output passage is formed between the first air stopper and the second air stopper. The second air stopper is connected with a bottom of the pressure limiting chamber through an elastic part, the pressure limiting chamber is further provided with a position limiting part at a bottom, and the position limiting part is capable of contacting the second air stopper.

Furthermore, the first air stopper and the second air stopper are formed into an integrated structure, and the air output passage is arranged inside the integrated structure.

Furthermore, the air curtain device is provided with a pressure dial on an outer wall, and the connecting rod is provided with a pointer which points to scale marks on the pressure dial.

Furthermore, the pressure linking member comprises a hemisphere flying gyro, a fixed bearing which is movably connected with the hemisphere flying gyro, and a balancing weight which is arranged symmetrically with respect to the hemisphere flying gyro. The balancing weight is connected with the hemisphere flying gyro, and the fixed bearing is fixed on an inner wall of the pressure limiting chamber. Under the action of the gas flow, the hemisphere flying gyro is capable of rotating in the pressure limiting chamber by taking the fixed bearing as a center, so that the hemisphere flying gyro changes the cross-sectional area of the first air outlet through which the gas flow passes.

Furthermore, the pressure limiting chamber has a circular cross section, and an arc length of the hemisphere flying gyro close to the pressure limiting chamber inner wall is larger than or equal to an arc length between the air inlet and the first air outlet of the pressure limiting chamber.

Furthermore, the air curtain body is provided with a first gas guiding channel and a second gas guiding channel which communicate with each other. The second gas guiding channel is provided with bionic membrane flaps in cross sectional directions. When the pressure in the second gas guiding channel is larger than a preset threshold, the bionic membrane flaps open, so that the gas flow is capable of passing through the bionic membrane flaps.

Furthermore, the second gas guiding channel comprises a second air outlet, and the second gas guiding channel is provided with a linking buckle at a position close to the second air outlet. The linking buckle contacts the bionic membrane flaps at one end and has a hook shape at the other end. When the bionic membrane flaps open, the bionic membrane flaps touch the other end of the linking buckle so that the bionic membrane flaps are fixed.

Furthermore, the air curtain body is provided with a reset screw at the bottom at a position corresponding to the linking buckle. The reset screw is configured to apply a torque to an end of the linking buckle for closing the bionic membrane flaps.

Furthermore, the air curtain body is provided with a third gas guiding channel. The third gas guiding channel has an end which communicates with the second gas guiding channel, the gas flow in the second gas guiding channel which passes through the bionic membrane flaps can enter the third gas guiding channel, and the other end of the third gas guiding channel is a sealed structure. A movable electrically conductive ball is arranged in the third gas guiding channel, and the third gas guiding channel is provided with a first electrically conductive plate and an opposite second electrically conductive plate on an inner wall. When the electrically conductive ball is located between the first electrically conductive plate and the second electrically conductive plate, the electrically conductive ball, an indicator light, and a power supply form a closed electrically conductive circuit.

Furthermore, the pressure limiting module communicates with the air curtain body through a gas guiding channel.

DETAILED DESCRIPTION OF EMBODIMENTS

The specific embodiments of the present disclosure shall be further described in the following text with reference to the figures and the embodiments. The following embodiments are only used for explaining more clearly the technical solution of the present disclosure rather than limiting the protection scope of the present disclosure.

Besides, the terms like "first", "second" are used for purpose of illustrating a feature, and are not interpreted to indicate or imply relative importance or implicitly indicate the number of the feature. Therefore, the feature prefixed with the terms like "first", "second" can explicitly or implicitly comprise one or more said feature. In the context, unless otherwise indicated, "a plurality of" indicates two or more.

Figure 1:
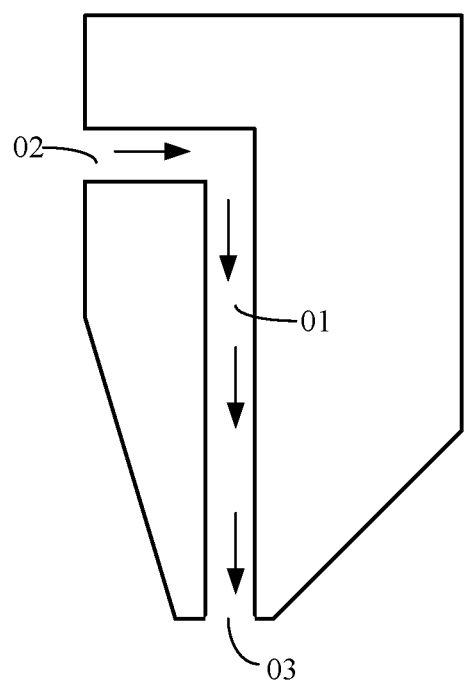
FIG. 1 is a structural view for illustrating an air curtain body in the prior art.
Figure 2:
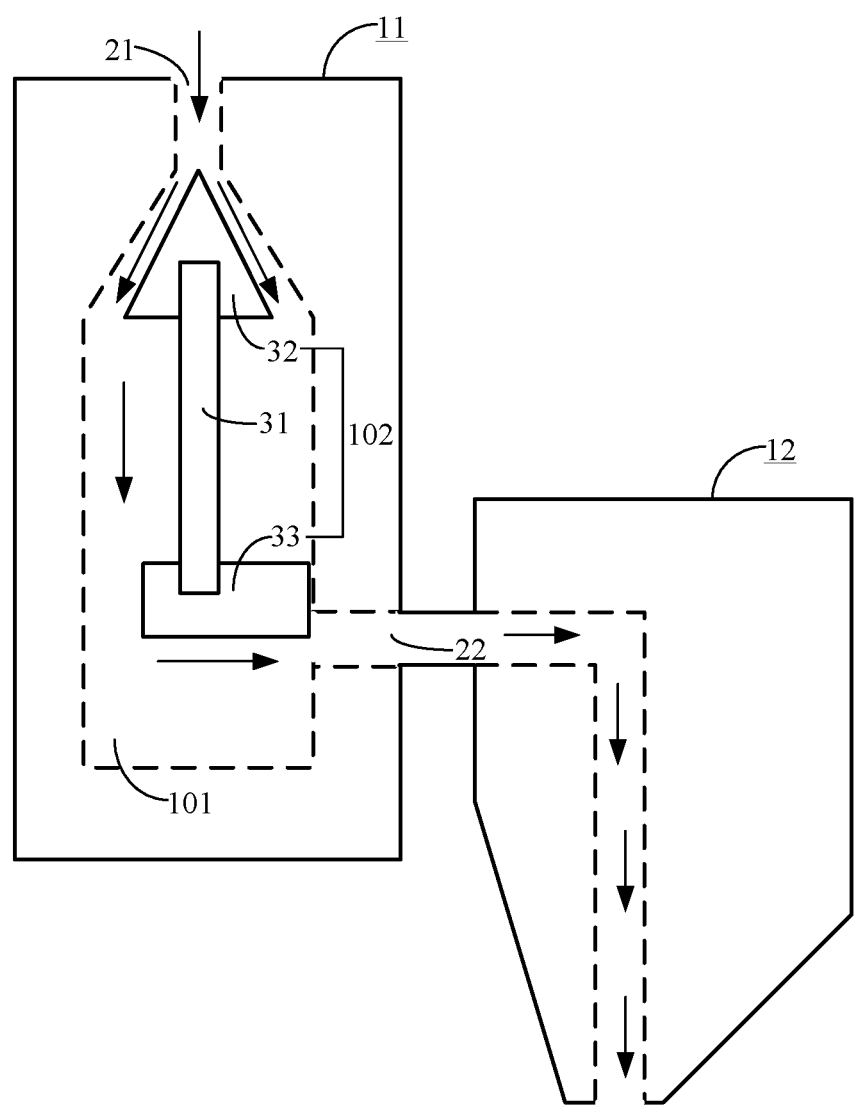
FIG. 2 is a first structural view for illustrating an air curtain device in an embodiment of the present disclosure.

An embodiment of the present disclosure provides an air curtain device. As shown in FIG. 2, the air curtain device comprises: a pressure limiting module 11, and an air curtain body 12 which communicates with the pressure limiting module 11. The pressure limiting module 11 is provided with a pressure limiting chamber 101. The pressure limiting chamber 101 has an air inlet 21 which is connected with a gas source, and a first air outlet 22 which communicates with an air inlet 02 of the air curtain body 12.

The pressure limiting chamber 101 is provided with a pressure linking member 102. The pressure linking member 102 is capable of changing a cross-sectional area of the first air outlet 22 through which a gas flow passes in accordance with variation of pressure in the pressure limiting chamber 101, so that the cross-sectional area of the first air outlet 22 through which the gas flow passes is kept in a preset range. Namely, the flux of gas passing through the first air outlet 22 can be kept in a preset range. Thus, the gas flow output from the first air outlet 22 has a pressure which can also be kept in a certain range, which ensures a stable flux for the gas flow output from the air curtain device, and increases the yield for fabricating the array substrate.

It is noted that the air curtain body 12 may have a structure similar with the prior art, and embodiments of the present disclosure do not intend to make restrictions in this regard.

As an example, still as shown in FIG. 2, the pressure linking member 102 particularly comprises a connecting rod 31 which is arranged along an air input direction. The connecting rod 31 is provided with a floater 32 at an end close to the air inlet 21. The connecting rod 31 is provided with a first air stopper 33 at an end close to the first air outlet 22.6

Figure 3:
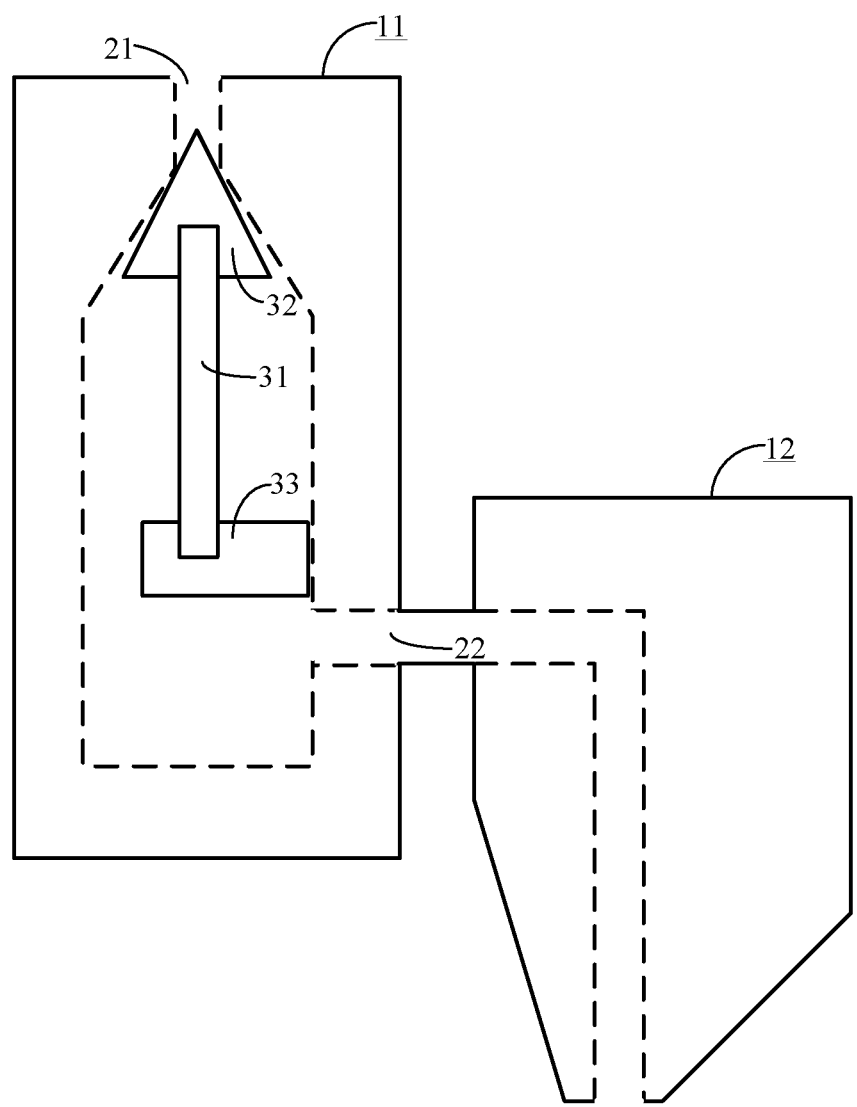
FIG. 3 is a second structural view for illustrating an air curtain device in an embodiment of the present disclosure.

The floater 32 operates under a similar principle with a floater flow meter. As shown in FIG. 3, when the gas flow input by the air inlet 21 has a low pressure, the floater 32 blocks the air inlet 21, and the gas flow does not move in the pressure limiting chamber 101. In this case, an alarm device can be provided to remind an operating staff that the air inlet 21 is inputting a gas flow with a low pressure.

Figure 4:
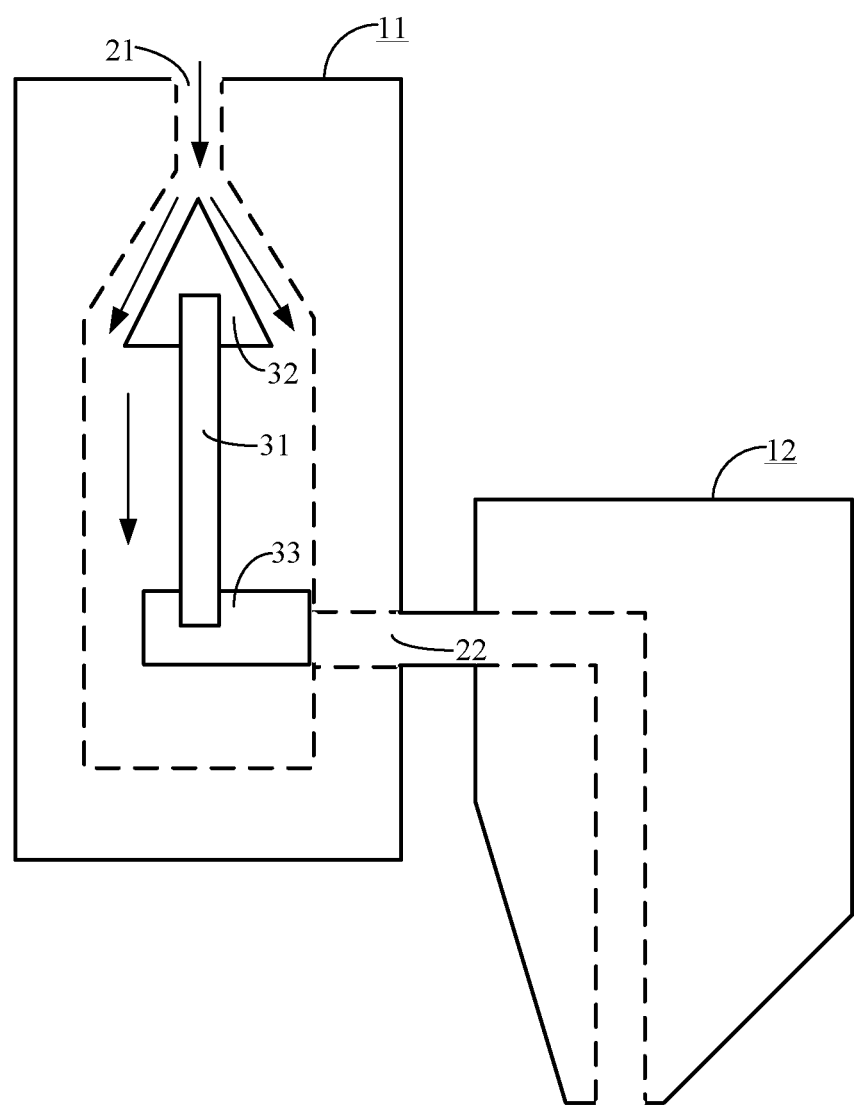
FIG. 4 is a third structural view for illustrating an air curtain device in an embodiment of the present disclosure.

When the gas flow input by the air inlet 21 has a pressure larger than a lower threshold, under the action of the gas flow, the floater 32 drives the first air stopper 33 to move up and down by means of the connecting rod 31. When the gas flow input by the air inlet 21 has a pressure larger than an upper threshold, as shown in FIG. 4, the first air stopper 33 can block the first air outlet 22. Therefore, the cross-sectional area of the first air outlet 22 through which the gas flow passes is kept in a preset range.

Figure 5:
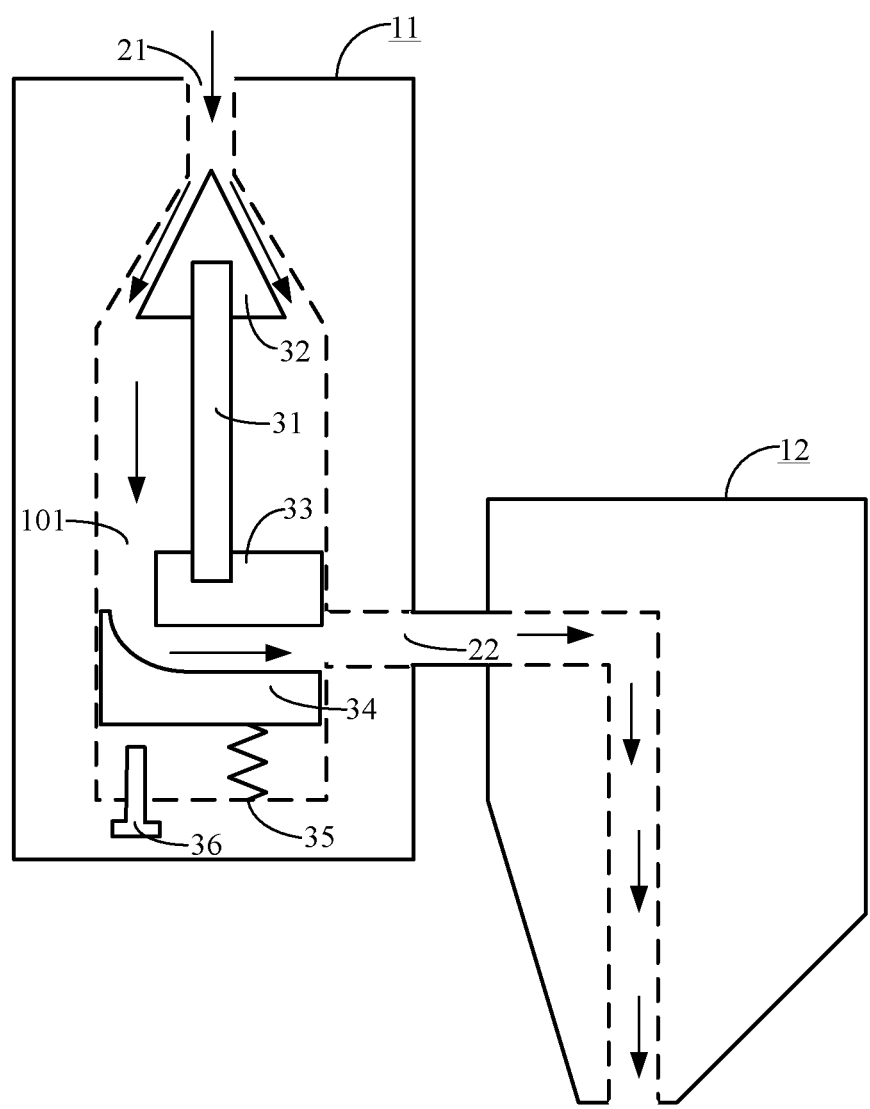
FIG. 5 is a fourth structural view for illustrating an air curtain device in an embodiment of the present disclosure.

Furthermore, as shown in FIG. 5, the pressure linking member 102 further comprises a second air stopper 34 which is arranged oppositely with respect to the first air stopper 33. An air output passage is formed between the first air stopper 33 and the second air stopper 34. The second air stopper 34 is connected with the bottom of the pressure limiting chamber 101 through an elastic part, e.g., a spring 35. The bottom of the pressure limiting chamber 101 is further provided with a position limiting part, for example, a position limiting screw 36. The position limiting screw 36 is capable of contacting the second air stopper 34.

When the gas flow input by the air inlet 21 has a pressure larger than the upper threshold, due to the action of the position limiting screw 36, an air output passage is formed between the second air stopper 34 and the first air stopper 33. In this case, the first air stopper 33 can be designed in such a manner that it does not completely block the first air outlet 22, and that the gas flow input by the air inlet 21 passes through the air output passage and is output from the first air outlet 22. In this way, when the gas flow input by the air inlet 21 has a pressure larger than the upper threshold, the pressure linking member 102 can still output a gas flow with a stable pressure to the air curtain body 12.

Figure 6:
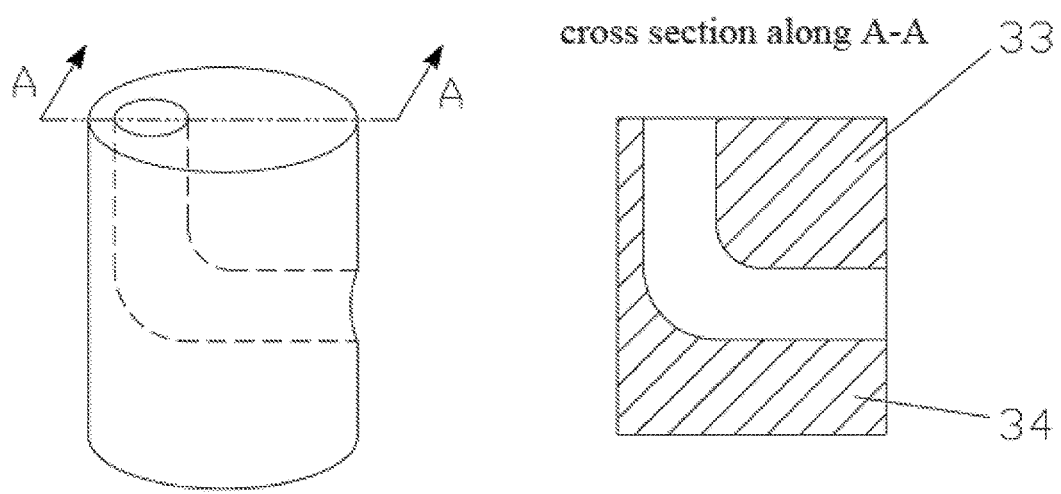
FIG. 6 is a fifth structural view for illustrating an air curtain device in an embodiment of the present disclosure.

Furthermore, as shown in FIG. 6, the first air stopper 33 and the second air stopper 34 can be formed into an integrated structure. The air output passage is arranged inside the integrated structure. Although the integrated structure of the first air stopper and the second air stopper shown in FIG. 6 is a cylinder, the present disclosure is not limited in this regard. The shape of the integrated structure can be selected by a person with ordinary skill in the art according to applications and requirements.

Figure 7:
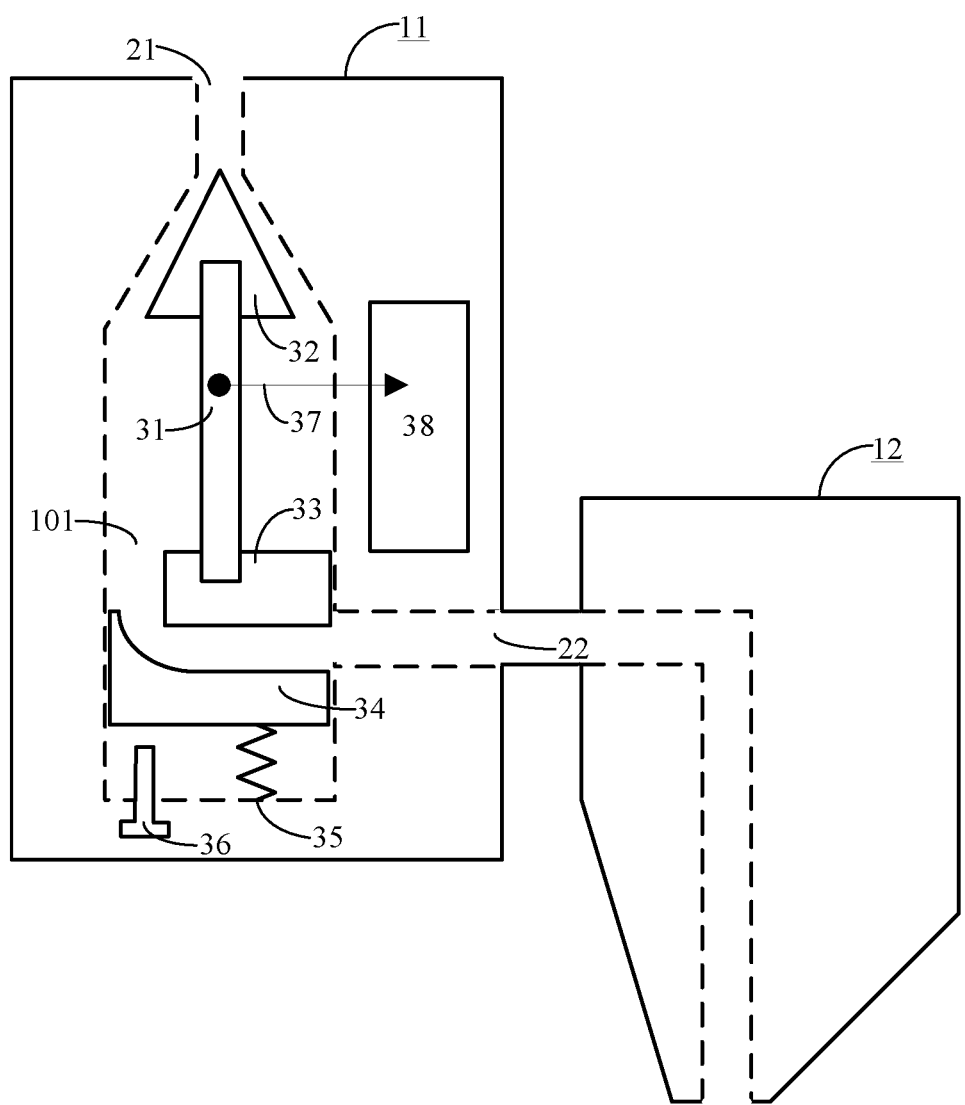
FIG. 7 is a sixth structural view for illustrating an air curtain device in an embodiment of the present disclosure.

Furthermore, as shown in FIG. 7, the connecting rod 31 is provided with a pointer 37, and the air curtain device is provided with a pressure dial 38 on an outer wall. The pointer 37 on the connecting rod 31 points to scale marks on the pressure dial 38. Under the action of the gas flow, the floater 32 can drive the connecting rod 31 to move up and down, thus drive the pointer 37 to point to different scale marks on the pressure dial 38. As a result, the operating staff can correctly know from the pressure dial 38 the current information about variation of pressure in the pressure limiting chamber 101.

Figure 8:
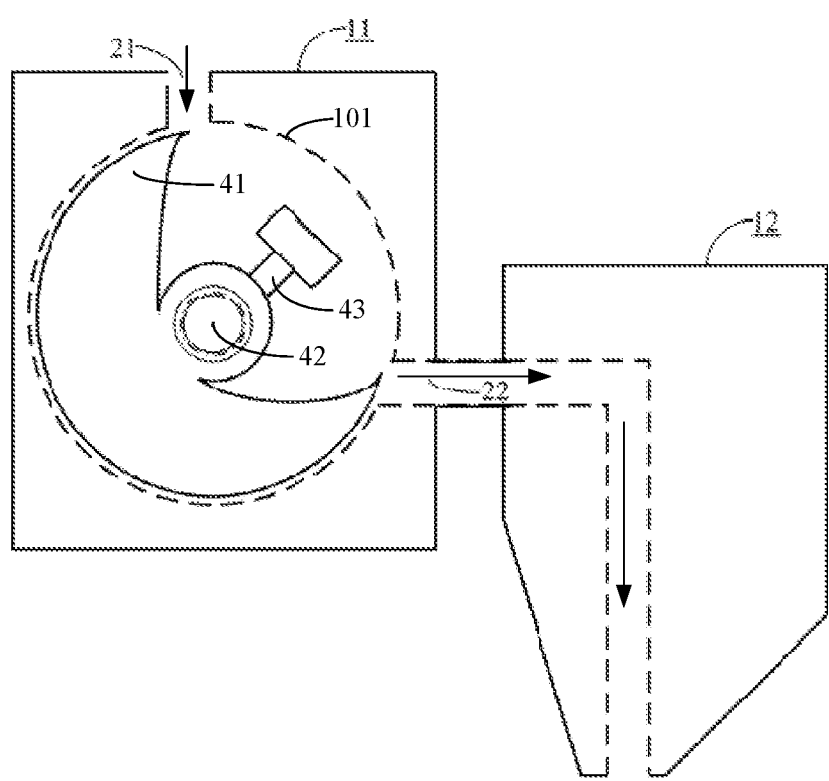
FIG. 8 is a seventh structural view for illustrating an air curtain device in an embodiment of the present disclosure.

An embodiment of the present disclosure further provides another design manner for the pressure linking member 102. As shown in FIG. 8, the pressure linking member 102 comprises a hemisphere flying gyro 41, a fixed bearing 42 which is movably connected with a center of the hemisphere flying gyro 41, and a balancing weight 43 which is symmetrically arranged with respect to the hemisphere flying gyro 41. The balancing weight 43 is connected with the hemisphere flying gyro 41, and the fixed bearing 42 is fixed on an inner wall of the pressure limiting chamber 101. Under the action of the gas flow, the hemisphere flying gyro 41 can rotate in the pressure limiting chamber 101 by taking the fixed bearing 42 as a center, so that the hemisphere flying gyro 41 changes the cross-sectional area of the first air outlet 22 through which the gas flow passes.

Furthermore, as shown in FIG. 8, the pressure limiting chamber 101 has a circular cross section. An arc length of the hemisphere flying gyro 41 at a side close to the inner wall of the pressure limiting chamber is larger than or equal to an arc length between the air inlet 21 and the first air outlet 22 of the pressure limiting chamber.

The pressure linking member 102 shown in FIG. 8 operate under a similar principle with that of the pressure linking member 102 shown in FIG. 1-FIG. 7. In particular, when the gas flow input by the air inlet the pressure limiting chamber 101 has a large pressure, the hemisphere flying gyro 41 rotates in the pressure limiting chamber 101 by taking the fixed bearing 42 as the center, and changes the cross-sectional area of the first air outlet 22 through which the gas flow passes, so that the cross-sectional area of the first air outlet 22 through which the gas flow passes is kept in a preset range. Therefore, the gas flow from the first air outlet 22 has a pressure which is kept in a preset range, which ensures a stable flux for the gas flow output from the air curtain device.

Figure 9:
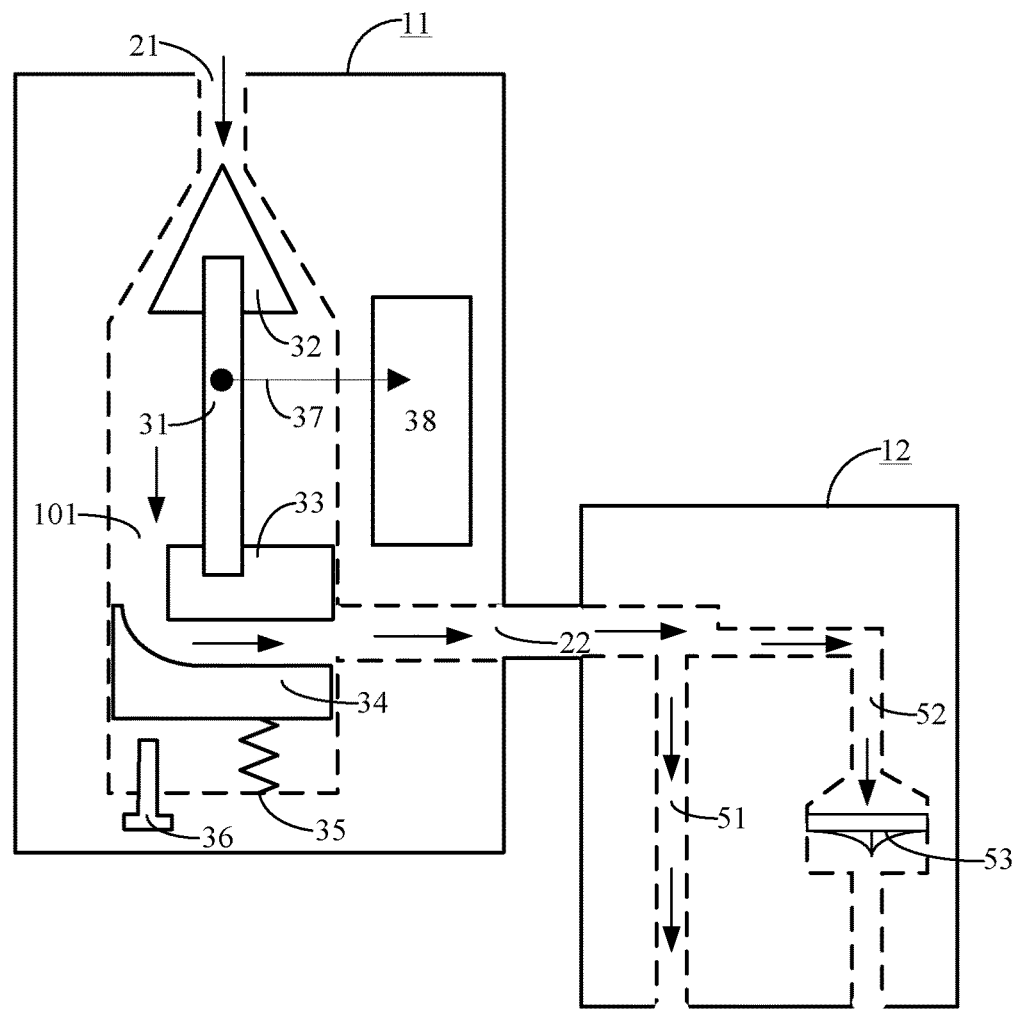
FIG. 9 is an eighth structural view for illustrating an air curtain device in an embodiment of the present disclosure.
Figure 10:
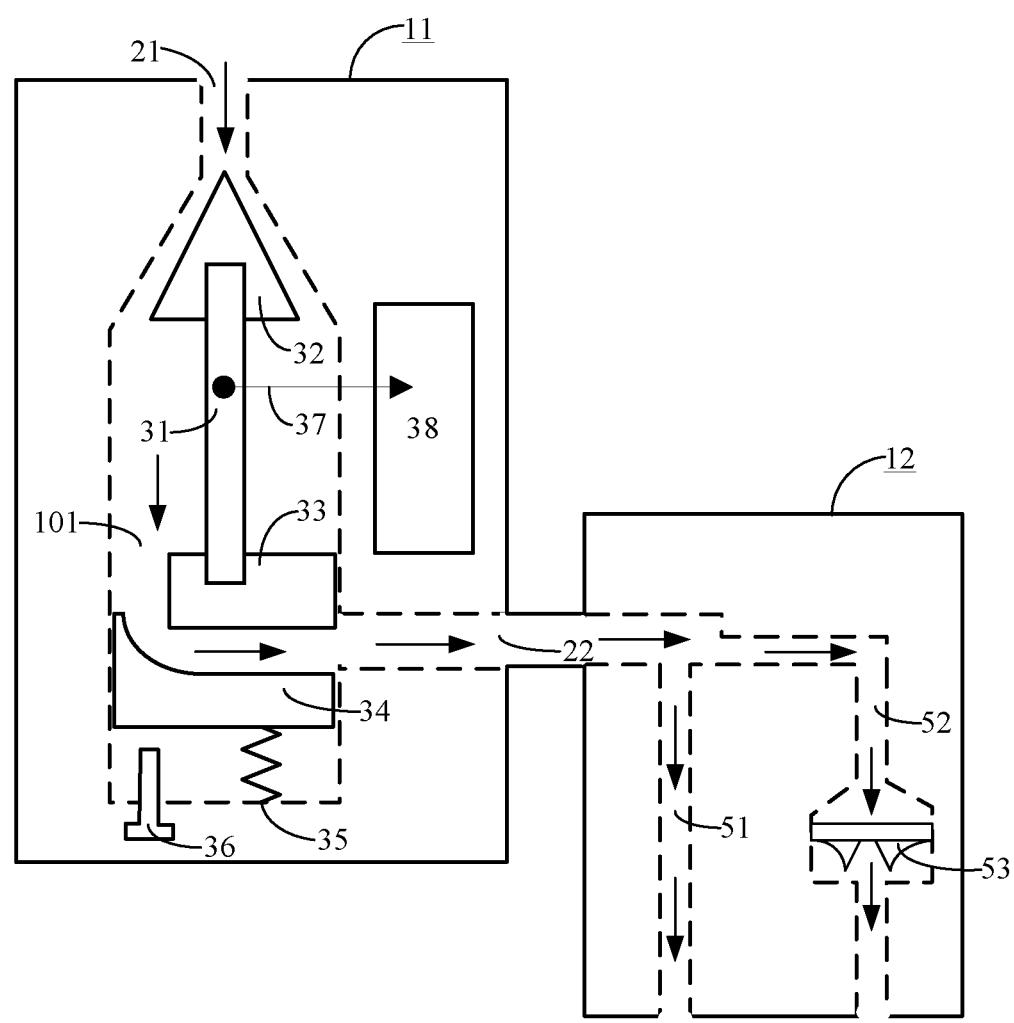
FIG. 10 is a ninth structural view for illustrating an air curtain device in an embodiment of the present disclosure.

Furthermore, by taking the pressure linking member 102 shown in FIG. 1-FIG. 7 as an example, the air curtain body 12 is provided with a first gas guiding channel 51 and a second gas guiding channel 52 which communicate with each other, as shown in FIG. 9. At the air outlet of the second gas guiding channel 52, i.e., at the second air outlet, the second gas guiding channel 52 is provided with bionic membrane flaps 53 in cross sectional directions. For example, the principle of membrane flaps in human blood vessels can be imitated to design the bionic membrane flaps 53. When the pressure in the second gas guiding channel 52 is larger than a preset threshold, as shown in FIG. 10, two membrane flaps among the bionic membrane flaps 53 open, so that the gas flow in the second gas guiding channel 52 can pass through the bionic membrane flaps and flow out of the air outlet of the second gas guiding channel 52.

In this way, when the first gas guiding channel 51 is blocked by foreign, or when the air outlet of the first gas guiding channel 51, i.e., a third air outlet, is relatively narrow, the pressure in the second gas guiding channel 52 which communicates with the first gas guiding channel 51 increases. When the pressure in the second gas guiding channel 52 is larger than a preset threshold, two membrane flaps among the bionic membrane flaps 53 open. Thus, the second gas guiding channel 52 acts as a standby passage for the first gas guiding channel 51. This alleviates or avoids problems like a lack of gas flow of the first gas guiding channel 51 or a breakpoint in the first gas guiding channel 51, and thus ensures that the air curtain body 12 discharges a gas flow continuously and uniformly.

Optionally, the bionic membrane flaps 53 can be made from rubber.

Figure 11:
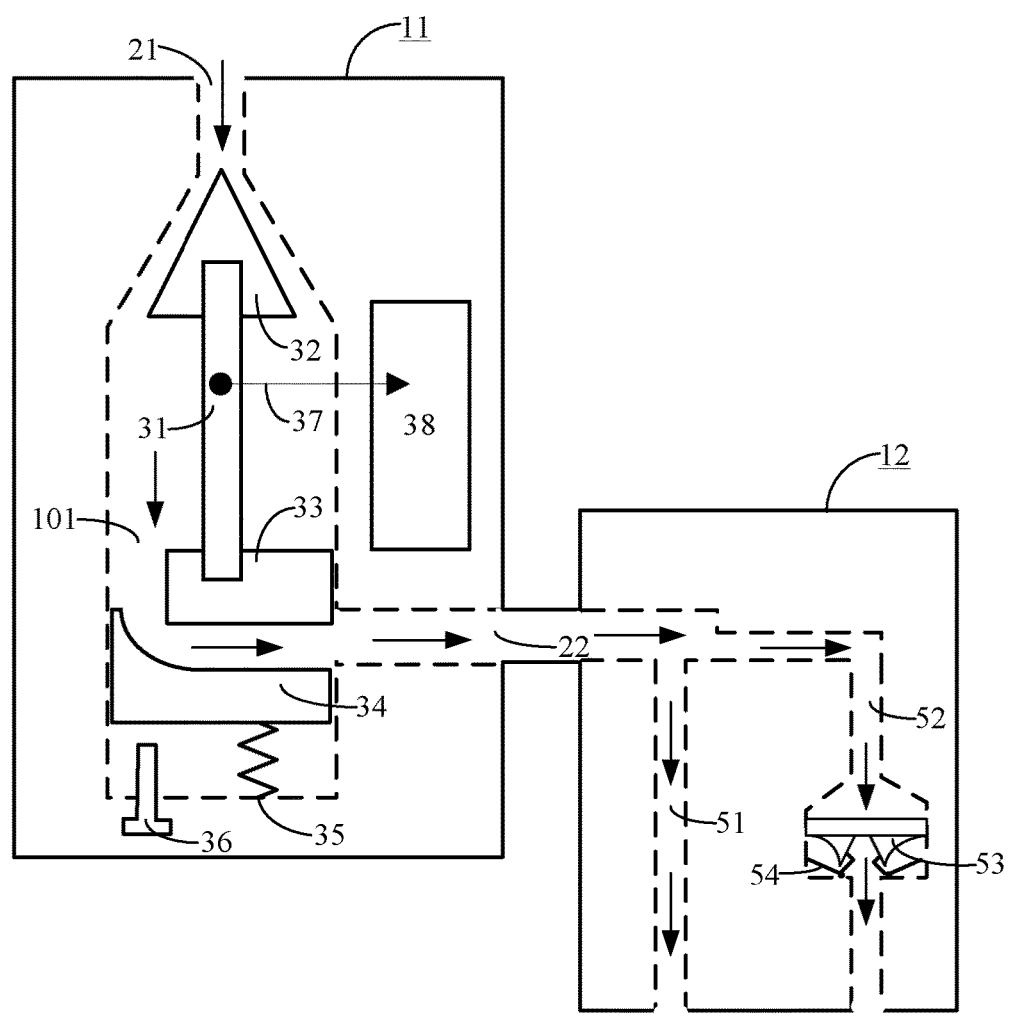
FIG. 11 is a tenth structural view for illustrating an air curtain device in an embodiment of the present disclosure.

Furthermore, as shown in FIG. 11, a linking buckle 54 is arranged in the second gas guiding channel 52 at a position close to the second air outlet. For example, the linking buckle 54 can have a shape of L. An end of the linking buckle 54 can contact the bionic membrane flaps 53, and the other end of the linking buckle 54 has a hook shape. In this way, when the bionic membrane flaps 53 open, the bionic membrane flaps 53 touch the hook shaped end of the linking buckle 54 to hook two membrane flaps among the bionic membrane flaps 53, so that the bionic membrane flaps 53 are fixed.

In this way, the second gas guiding channel 52 can continuously output the gas flow. Thus, it is possible to avoid problems like a pulsed gas flow which results from closing of the bionic membrane flaps 53 due to their own elasticity.

Figure 12:
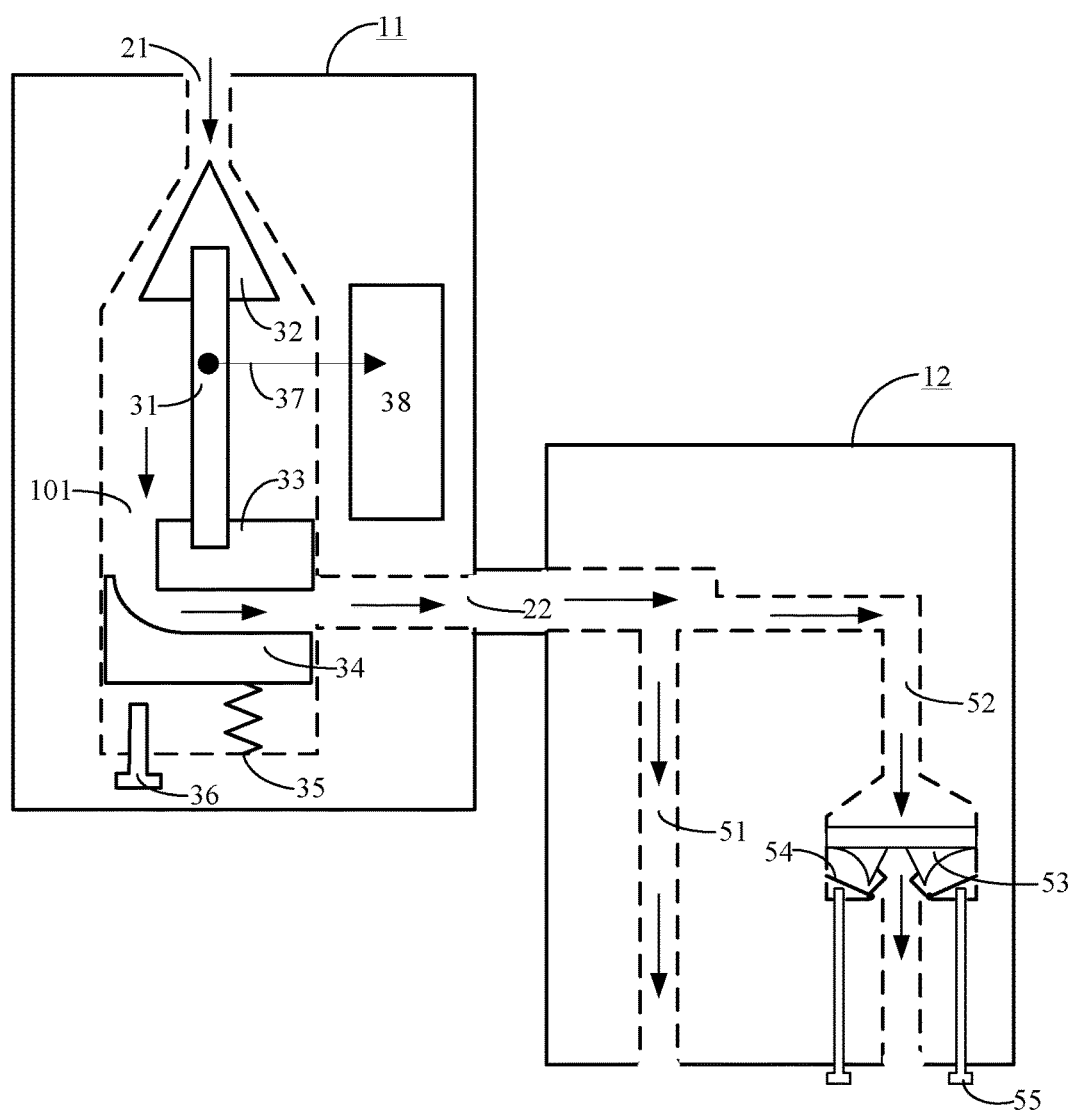
FIG. 12 is an eleventh structural view for illustrating an air curtain device in an embodiment of the present disclosure and FIG. 13 is a twelfth structural view for illustrating an air curtain device in an embodiment of the present disclosure.

When it is necessary to close the second gas guiding channel 52, a reset screw 55 is arranged at the bottom of the air curtain body 12 at a position corresponding to the linking buckle 54, as shown in FIG. 12. When the reset screw 55 is tightened up, the reset screw 55 can apply a torque to an end of the linking buckle 54, so that the torque balance between the linking buckle 54 and the bionic membrane flaps 53 is destroyed, and the bionic membrane flaps 53 are closed.

Figure 13:
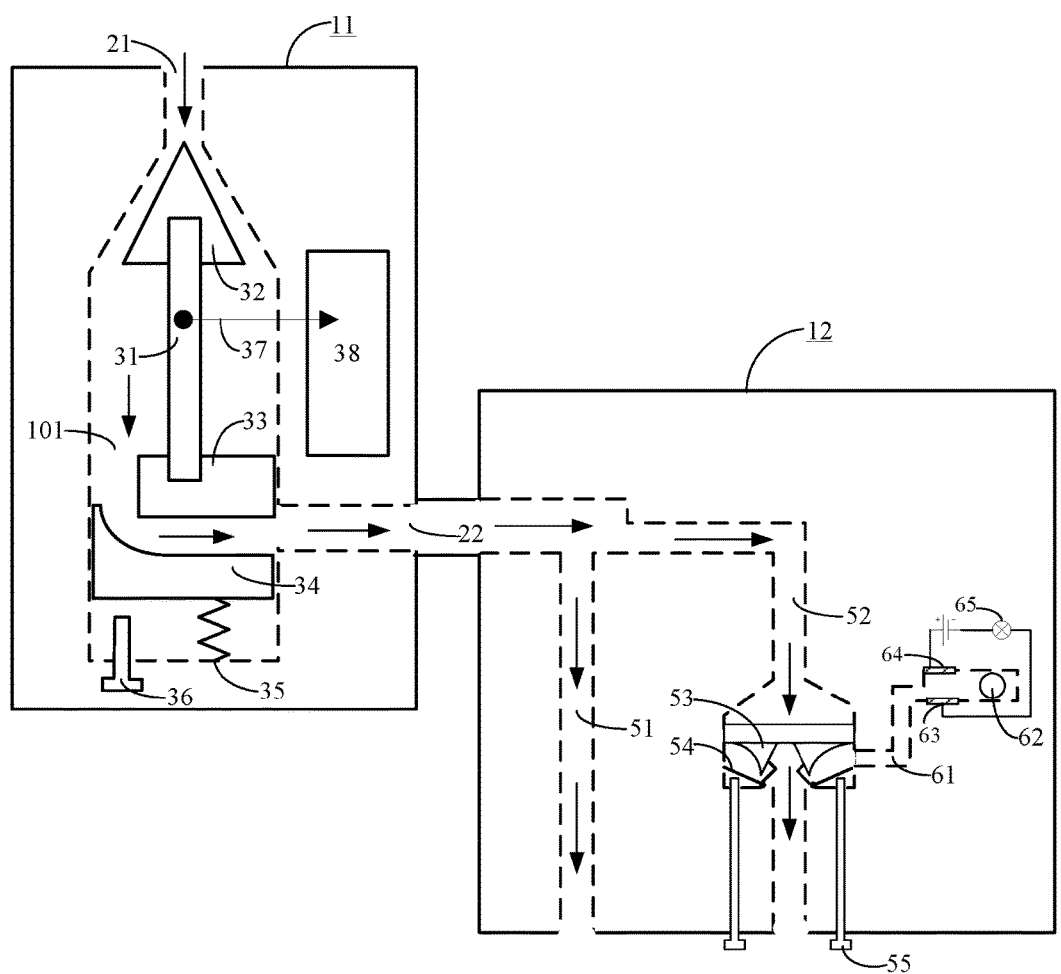

Furthermore, as shown in FIG. 13, the air curtain body 12 is provided with a third gas guiding channel 61. An end of the third gas guiding channel 61 communicates with the second gas guiding channel 52, and the gas flow in the second gas guiding channel 52 which passes through the bionic membrane flaps 53 can enter the third gas guiding channel 61. The other end of the third gas guiding channel 61 is a sealed structure. For example, the other end of the third gas guiding channel 61 adopts an arc-shaped O-ring (seal ring), to ensure that the third gas guiding channel 61 is gas tight.

In particular, as shown in FIG. 13, a movable electrically conductive ball 62 is arranged in the third gas guiding channel 61. A first electrically conductive plate 63 and an opposite second electrically conductive plate 64 are arranged on an inner wall of the third gas guiding channel 61. When the bionic membrane flaps 53 close (i.e., the second gas guiding channel 52 is not in use), the electrically conductive ball 62 is located between the first electrically conductive plate 63 and the second electrically conductive plate 64. In this case, the electrically conductive ball 62, an indicator light 65, and a power supply form a closed electrically conductive circuit. The indicator light 65 is lighted, indicating to the operating staff that currently the second gas guiding channel 52 is not in use.

When the bionic membrane flaps 53 open (i.e., the second gas guiding channel 52 is in use), the pressure in the second gas guiding channel 52 increases. The pressure in the third gas guiding channel 61 which communicates with the second gas guiding channel 52 increases accordingly, thus pushing the electrically conductive ball 62 away from the first electrically conductive plate 63 and the second electrically conductive plate 64. In this case, the electrically conductive circuit formed by the electrically conductive ball 62, the indicator light 65, and the power supply is disconnected, The indicator light 65 turns off, indicating to the operating staff that currently the second gas guiding channel 52 is in use.

Optionally, as shown in FIG. 1-FIG. 13, the pressure limiting module 11 communicates with the air curtain body 12 through a gas guiding channel.

To this end, embodiments of the present disclosure provide an air curtain device. The air curtain device particularly comprises a pressure limiting module, and an air curtain body which communicates with the pressure limiting module. The pressure limiting module is provided with a pressure limiting chamber. The pressure limiting chamber has an air inlet which communicates with a gas source, and a first air outlet which communicates with the air curtain body. The pressure limiting chamber is provided with a pressure linking member. The pressure linking member is capable of changing a cross-sectional area of the first air outlet through which the gas flow passes in accordance with variation of pressure in the pressure limiting chamber, so that the gas flow output from the first air outlet has a pressure which is kept in a preset range. In this way, since the cross-sectional area of the first air outlet through which the gas flow passes is kept in a certain range, the gas flow output from the first air outlet has a pressure which can also be kept in a preset range, which ensures a stable flux for the gas flow output from the air curtain device, and increases the yield for fabricating the array substrate.

In the context of the present disclosure, the specific features, structures, materials, or characteristics can be combined appropriately in any one or more embodiments or examples.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:
1. An air curtain device, comprising:
a pressure limiting module; and
an air curtain body which communicates with the pressure limiting module,
wherein the pressure limiting module is provided with a pressure limiting chamber, and the pressure limiting chamber has an air inlet which is connected with a gas source and a first air outlet which communicates with the air curtain body, and
wherein the pressure limiting chamber is provided with a pressure linking member, and the pressure linking member is capable of changing a cross-sectional area of the first air outlet through which a gas flow passes in accordance with variation of pressure in the pressure limiting chamber, so that the gas flow which is output from the first air outlet to the air curtain body has a pressure which is kept in a preset range.
2. The air curtain device of claim 1, wherein the pressure linking member comprises a connecting rod which is arranged along an air input direction, and the connecting rod is provided with a floater at an end close to the air inlet and a first air stopper at an end close to the first air outlet, and
wherein under an action of the gas flow, the floater drives the first air stopper to move up and down by means of the connecting rod, so that the first air stopper changes the cross-sectional area of the first air outlet through which the gas flow passes.
3. The air curtain device of claim 2, wherein the pressure linking member further comprises a second air stopper which is arranged oppositely to the first air stopper, an air output passage is formed between the first air stopper and the second air stopper, and
wherein the second air stopper is connected with a bottom of the pressure limiting chamber through an elastic part, the pressure limiting chamber is further provided with a position limiting part at a bottom, and the position limiting part is capable of contacting the second air stopper.
4. The air curtain device of claim 3, wherein the first air stopper and the second air stopper are formed into an integrated structure, and the air output passage is arranged inside the integrated structure.
5. The air curtain device of claim 2, wherein the air curtain device is provided with a pressure dial on an outer wall, and the connecting rod is provided with a pointer which points to scale marks on the pressure dial.
6. The air curtain device of claim 1, wherein the pressure linking member comprises a hemisphere flying gyro, a fixed bearing which is movably connected with the hemisphere flying gyro, and a balancing weight which is arranged symmetrically with respect to the hemisphere flying gyro,
wherein the balancing weight is connected with the hemisphere flying gyro, the fixed bearing is fixed on an inner wall of the pressure limiting chamber, and
wherein under an action of the gas flow, the hemisphere flying gyro is capable of rotating in the pressure limiting chamber by taking the fixed bearing as a center, so that the hemisphere flying gyro changes the cross-sectional area of the first air outlet through which the gas flow passes.
7. The air curtain device of claim 6, wherein the pressure limiting chamber has a circular cross section, and an arc length of the hemisphere flying gyro close to the pressure limiting chamber inner wall is larger than or equal to an arc length between the air inlet and the first air outlet of the pressure limiting chamber.
8. The air curtain device of claim 1, wherein the air curtain body is provided with a first gas guiding channel and a second gas guiding channel which communicate with each other,
wherein the second gas guiding channel is provided with bionic membrane flaps in cross sectional directions, and when a pressure in the second gas guiding channel is larger than a preset threshold, the bionic membrane flaps open, so that the gas flow is capable of passing through the bionic membrane flaps.
9. The air curtain device of claim 8, wherein the second gas guiding channel comprises a second air outlet, the second gas guiding channel is provided with a linking buckle at a position close to the second air outlet, and the linking buckle contacts the bionic membrane flaps at one end and has a hook shape at another end, and
wherein when the bionic membrane flaps open, the bionic membrane flaps touch said another end of the linking buckle so that the bionic membrane flaps are fixed.
10. The air curtain device of claim 9, wherein the air curtain body is provided with a reset screw at a bottom at a position corresponding to the linking buckle, and the reset screw is configured to apply a torque to an end of the linking buckle for closing the bionic membrane flaps.

11. The air curtain device of claim 8, wherein the air curtain body is provided with a third gas guiding channel, and the third gas guiding channel has an end which communicates with the second gas guiding channel, the gas flow in the second gas guiding channel which passes through the bionic membrane flaps can enter the third gas guiding channel, and another end of the third gas guiding channel is a sealed structure, wherein a movable electrically conductive ball is arranged in the third gas guiding channel, the third gas guiding channel is provided with a first electrically conductive plate and an opposite second electrically conductive plate on an inner wall, and when the electrically conductive ball is located between the first electrically conductive plate and the second electrically conductive plate, the electrically conductive ball, an indicator light, and a power supply form a closed electrically conductive circuit.

12. The air curtain device of claim 1, wherein the pressure limiting module communicates with the air curtain body through a gas guiding channel.

13. The air curtain device of claim 2, wherein the air curtain body is provided with a first gas guiding channel and a second gas guiding channel which communicate with each other, wherein the second gas guiding channel is provided with bionic membrane flaps in cross sectional directions, and when a pressure in the second gas guiding channel is larger than a preset threshold, the bionic membrane flaps open, so that the gas flow is capable of passing through the bionic membrane flaps.

14. The air curtain device of claim 3, wherein the air curtain body is provided with a first gas guiding channel and a second gas guiding channel which communicate with each other, wherein the second gas guiding channel is provided with bionic membrane flaps in cross sectional directions, and when a pressure in the second gas guiding channel is larger than a preset threshold, the bionic membrane flaps open, so that the gas flow is capable of passing through the bionic membrane flaps.

15. The air curtain device of claim 4, wherein the air curtain body is provided with a first gas guiding channel and a second gas guiding channel which communicate with each other, wherein the second gas guiding channel is provided with bionic membrane flaps in cross sectional directions, and when a pressure in the second gas guiding channel is larger than a preset threshold, the bionic membrane flaps open, so that the gas flow is capable of passing through the bionic membrane flaps.

16. The air curtain device of claim 5, wherein the air curtain body is provided with a first gas guiding channel and a second gas guiding channel which communicate with each other, wherein the second gas guiding channel is provided with bionic membrane flaps in cross sectional directions, and when a pressure in the second gas guiding channel is larger than a preset threshold, the bionic membrane flaps open, so that the gas flow is capable of passing through the bionic membrane flaps.

17. The air curtain device of claim 2, wherein the pressure limiting module communicates with the air curtain body through a gas guiding channel.

18. The air curtain device of claim 3, wherein the pressure limiting module communicates with the air curtain body through a gas guiding channel.

19. The air curtain device of claim 4, wherein the pressure limiting module communicates with the air curtain body through a gas guiding channel.

20. The air curtain device of claim 5, wherein the pressure limiting module communicates with the air curtain body through a gas guiding channel.

* * * * *